(12) United States Patent
Brazzle et al.

(10) Patent No.: US 10,497,635 B2
(45) Date of Patent: Dec. 3, 2019

(54) STACKED CIRCUIT PACKAGE WITH MOLDED BASE HAVING LASER DRILLED OPENINGS FOR UPPER PACKAGE

(71) Applicant: Linear Technology Holding LLC, Norwood, MA (US)

(72) Inventors: John D. Brazzle, Tracy, CA (US); Frederick E. Beville, San Jose, CA (US); David R. Ng, San Jose, CA (US); Michael J. Anderson, Campbell, CA (US); Yucheng Ying, San Jose, CA (US)

(73) Assignee: Linear Technology Holding LLC, Wilmington, DE (US)

( * ) Notice: Subject to any disclaimer, the term of this patent is extended or adjusted under 35 U.S.C. 154(b) by 0 days.

(21) Appl. No.: 16/152,182

(22) Filed: Oct. 4, 2018

(65) Prior Publication Data

US 2019/0304865 A1 Oct. 3, 2019

Related U.S. Application Data

(60) Provisional application No. 62/648,835, filed on Mar. 27, 2018.

(51) Int. Cl.
*H01L 23/31* (2006.01)
*H01F 27/29* (2006.01)
(Continued)

(52) U.S. Cl.
CPC ......... *H01L 23/3128* (2013.01); *H01F 27/29* (2013.01); *H01L 21/56* (2013.01);
(Continued)

(58) Field of Classification Search
CPC . H01L 23/3128; H01L 21/4853; H01L 21/56; H01L 23/49827; H01L 25/16;
(Continued)

(56) References Cited

U.S. PATENT DOCUMENTS 5,535,101 A * 7/1996 Miles .................... H01L 21/563
174/260
2014/0145319 A1 5/2014 Meinhold et al.
(Continued)

FOREIGN PATENT DOCUMENTS

EP 0384927 A1 9/1990
EP 3217774 A1 9/2017

OTHER PUBLICATIONS

PCT/US2019/021908, EPO as ISA, "International Search Report and Written Opinion," 16 pages.

*Primary Examiner* — Jasmine J Clark
(74) *Attorney, Agent, or Firm* — Patent Law Group LLP; Brian D. Ogonowsky

(57) ABSTRACT

A stacked package configuration is described that includes a bottom package and an upper package. The bottom package includes a substrate having a top surface with first circuitry and metal first pads. A molded layer is then formed over the substrate. Holes through the molded layer are then laser drilled to expose the first pads. The holes and first pads align with leads of an upper package, which contains further circuit components. The holes are then partially filled with a solder paste. A thermal epoxy is applied between the molded layer and the upper package. The leads of the upper package are then inserted into the holes, and the solder paste is reflowed to electrically, thermally, and mechanically connect the upper package to the bottom package. The reflow heat also cures the epoxy. A ball grid array is then formed on the bottom of the substrate.

27 Claims, 8 Drawing Sheets

(51) Int. Cl.
　　　*H01L 21/56*　　　(2006.01)
　　　*H01L 23/367*　　(2006.01)
　　　*H01L 23/498*　　(2006.01)
　　　*H01L 25/16*　　　(2006.01)
　　　*H01L 25/07*　　　(2006.01)
　　　*H01L 21/48*　　　(2006.01)
(52) U.S. Cl.
　　　CPC .... *H01L 23/3677* (2013.01); *H01L 23/49827* (2013.01); *H01L 25/072* (2013.01); *H01L 25/16* (2013.01); *H01L 21/4853* (2013.01)
(58) Field of Classification Search
　　　CPC . H01L 23/3677; H01L 21/561; H01L 21/565; H01L 25/105; H01F 27/29
　　　See application file for complete search history.

(56) References Cited

U.S. PATENT DOCUMENTS

| | | | |
|---|---|---|---|
| 2015/0061095 A1* | 3/2015 | Choi | H01L 24/20 257/675 |
| 2016/0150632 A1 | 5/2016 | Viswanathan et al. | |
| 2017/0179048 A1 | 6/2017 | Moussaoui et al. | |

* cited by examiner

STACKED CIRCUIT PACKAGE WITH MOLDED BASE HAVING LASER DRILLED OPENINGS FOR UPPER PACKAGE

CROSS-REFERENCE TO RELATED APPLICATIONS

This application is based on and claims priority from U.S. Provisional Patent Application Ser. No. 62/648,835, filed Mar. 27, 2018, by John D. Brazzle et al., incorporated herein by reference.

FIELD OF THE INVENTION

This invention relates to the packaging of electronic components and, in particular, to a stacked package structure having a base package and an interconnected upper package.

BACKGROUND

It is common to provide an integrated circuit, or a circuit formed of discrete components, in a single sealed package having a standardized terminal configuration (e.g., ball grid array, in-line pins, surface mount leads, etc.). The terminals of the package are typically then soldered to a printed circuit board along with other packages and components.

Relevant factors in a package design include size, terminal count, heat dissipation, current/voltage requirements, and electrical/magnetic interference issues.

To reduce the size of an electrical system, it is known to stack packages on top of each other, where the bottom package includes bottom terminals, for being soldered to a printed circuit board, and top terminals for being soldered to the terminals of the upper package. The bottom package has vias leading from its top terminals to internal circuitry or to the bottom terminals on the bottom package. This is also referred to as a 3-dimensional package.

For certain applications, such as high power applications, a more robust structure is needed for stacked packages. For such high power applications, such as a 20 A-100 A switching voltage regulator, it is desirable to provide very low impedance current paths to minimize heat and voltage drop, as well as provide good thermal paths to air and to a metal core printed circuit board. Also, certain components, such as inductors and transformers, should be separated from other circuits for minimizing magnetic coupling and noise.

Therefore, what is needed is a more robust package that solves some of the existing problems with conventional stacked packing technology.

SUMMARY

In one embodiment of the invention, a circuit is formed of components included in both a bottom package and an upper package. The bottom package may include a switching transistor and control circuitry for a high power switching voltage regulator. The bottom package includes a substrate having on its top surface circuitry, metal traces for interconnecting the circuitry, and metal pads connected to the circuitry. The metal pads align with leads of an upper package. The bottom surface of the bottom package may include a ball grid array for soldering to a conventional metal core printed circuit board.

The circuitry on the bottom package is then encapsulated with a molded thermal plastic to form a rectangular package with a top planar surface.

A programmed laser is then controlled to drill openings in the molded plastic which extend down to the metal pads on the substrate. The holes are then partially filled with a solder, a solder paste, or other conductive material. The laser not only drills the holes but cleans the metal pads on the substrate.

Next, an upper package, such as containing a relatively large smoothing inductor for the switching regulator, is positioned over the bottom package. The upper package has bottom terminals, such as posts or staple-type leads, that extend through the holes and electrically contact the pads exposed through the holes.

Preferably, there is a small gap between the ends of the leads of the upper package and the rigid metal pads formed on the substrate of the bottom package so the upper package may be tilted, as required, to have a top planar surface that is precisely parallel to the bottom surface of the bottom package irrespective of the non-planarity of the leads of the upper package. This ensures that the top of the upper package will be coplanar with the tops of other upper packages on the printed circuit board, such as for contacting a single heat sink with a flat surface. The gaps are pre-filled with a solder paste, solder, or other suitable conductive material that melts during reflow and allows the top of the upper package to be tilted to be precisely parallel with the bottom of the bottom package.

The stacked structure is then reflowed to melt and cure any solder paste, solder, or other conductive material so that the upper package is electrically, thermally, and mechanically connected to the bottom package. The upper package may also be epoxied to the top of the bottom package, using a thermal epoxy, which cures during the reflow.

Solder balls for a ball grid array may then be formed on the bottom of the bottom package and reflowed. The cured epoxy between the upper package and the bottom package ensures the upper package will not change its position during the ball grid array reflow.

If the upper package is a smoothing inductor for a switching regulator, and the bottom package contains the rest of the switching regulator circuitry, there will be excellent heat transfer between the inductor and the metal core printed circuit board since the leads of the inductor are directly connected to the metal pads on the substrate of the bottom package. Also, the inductor is vertically separated from the remaining circuitry and may be magnetically isolated from the bottom circuitry.

Although a switching regular with an inductor has been used in the example, the technique may be used to form any other circuit. For example, the upper package may include a transformer.

The upper package does not need to be an electrical component. The upper device may be a metal heat sink with robust tabs that extend through holes in the bottom package and thermally contact metal pads on the substrate of the bottom package. The upper device may also provide RF shielding, such as being a grounded plate, or provide any other function.

An array of stacked packages may be formed simultaneously prior to singulation of the packages, such as by sawing.

DETAILED DESCRIPTION

Although the stacked package may be used for any type of circuitry, an example will be provided for a high power switching regulator having a stacked transformer or inductor. The regulator may provide an output current of up to 100 A to a load due to the particular design described.

Figure 1:
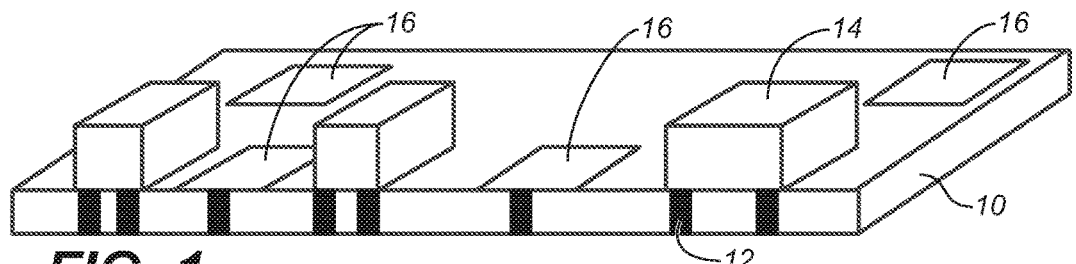
FIG. 1 is a cross-sectional perspective view of a substrate with circuitry mounted on the top of the substrate and conductive through-vias that electrically contact bottom pads of the substrate. Also shown are relatively large metal pads on the top of the substrate that are to be contacted by leads of an upper package.

FIG. 1 is a cross-sectional view of a starting substrate 10 for a bottom package. The substrate 10 may be a conventional printed circuit board material or a molded thermal plastic. In one embodiment, the substrate 10 is about 0.3 mm thick. The substrate 10 has conductive through-vias 12 that may be contacted by metal traces on the top the surface of the substrate 10 that interconnect circuit components 14. The components 14 may include integrated circuits and discrete components. The vias 12 terminate in bottom metal pads, such as for a ball grid array.

Relatively large top pads 16 are also shown, which align with leads of an upper package. Some of the vias 12 may terminate in the top pads 16. The pads 16 may be interconnected to other circuitry on the substrate 10. The vias 12 may be used for conducting heat from the upper package to a metal core printed circuit board. Some vias 12 may be connected together for a parallel conduction path.

In the example, the circuitry forms a switching transistor and control circuitry for a switching voltage regulator.

Figure 2:
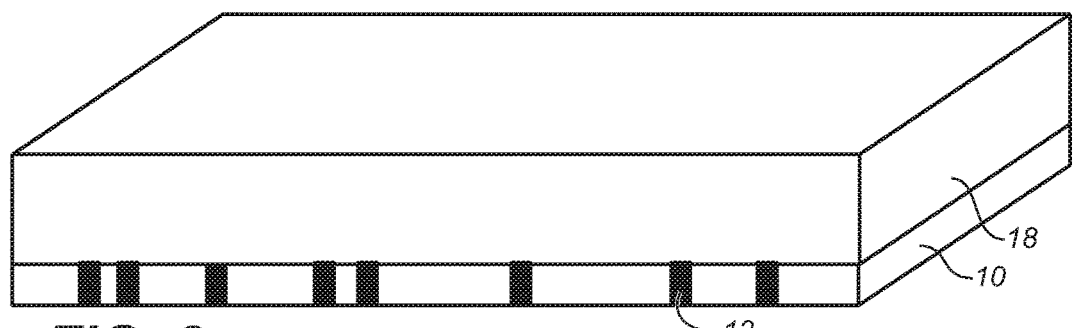
FIG. 2 illustrates the substrate of FIG. 1 after a thermal plastic is molded over the top of the substrate to encapsulate the circuitry and provide a planar top surface.

FIG. 2 illustrates a thermal plastic 18 molded over the substrate 10 to encapsulate the circuitry. The top of the plastic 18 is planar. The plastic 18 is a very good conductor of heat and is a dielectric.

Figure 3:
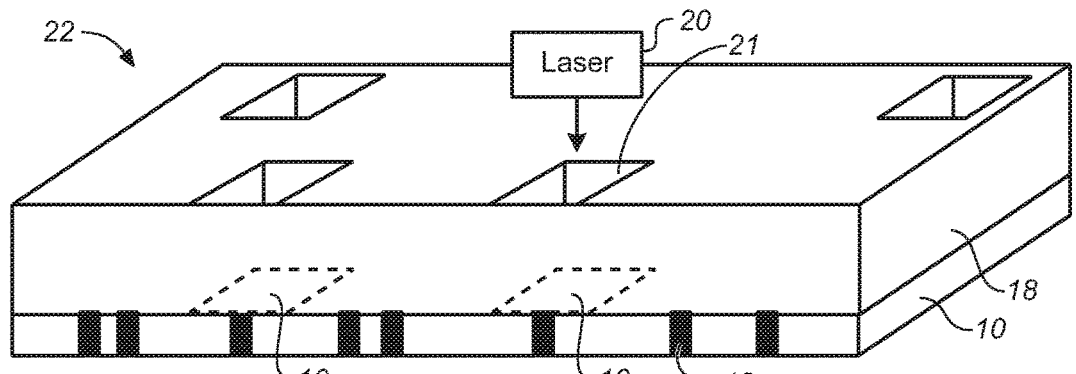
FIG. 3 illustrates a programmed laser drilling holes in the thermal plastic to expose the pads on the substrate.

In FIG. 3, a programmed laser 20 ablates holes 21 (of any shape) in the plastic 18 to expose the pads 16 on the substrate 10. In one embodiment, the pads 16 are formed to have a layer of solder for better wicking to metal leads of an upper package. The laser drilling automatically stops at the solder/pad surface and may clean the surface. The resulting structure is a bottom package 22 for the stacked package structure.

Figure 4:
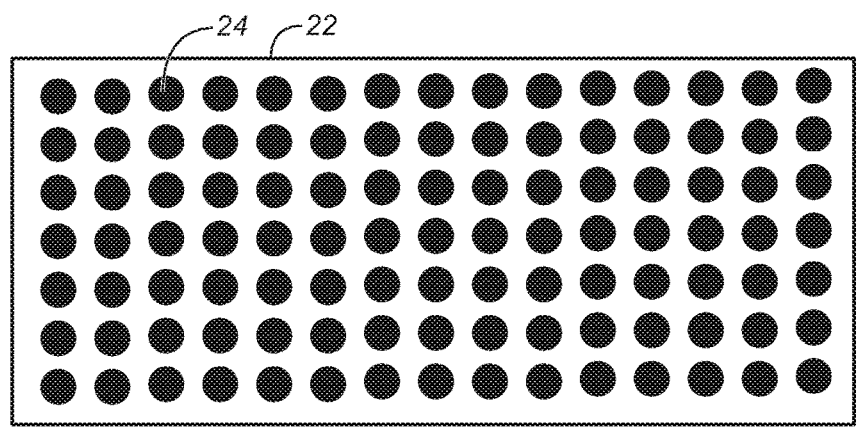
FIG. 4 illustrates the bottom of the package showing a ball grid array configuration for being soldered to a printed circuit board.

FIG. 4 illustrates a possible bottom surface of the bottom package 22 showing small metal pads 24 for a ball grid array.

A conductive material, such as solder, a solder paste, or a conductive epoxy is then dispensed into each of the holes 21 and will be used to electrically connect leads of an upper package to the pads 16 while not requiring the leads to directly abut the pads 16. This conductive material filling the gap between the leads and the pads 16 allows the upper package to be tilted, during a reflow step, to be precisely parallel to the bottom package 22 even if the leads are not planar.

Figure 5:
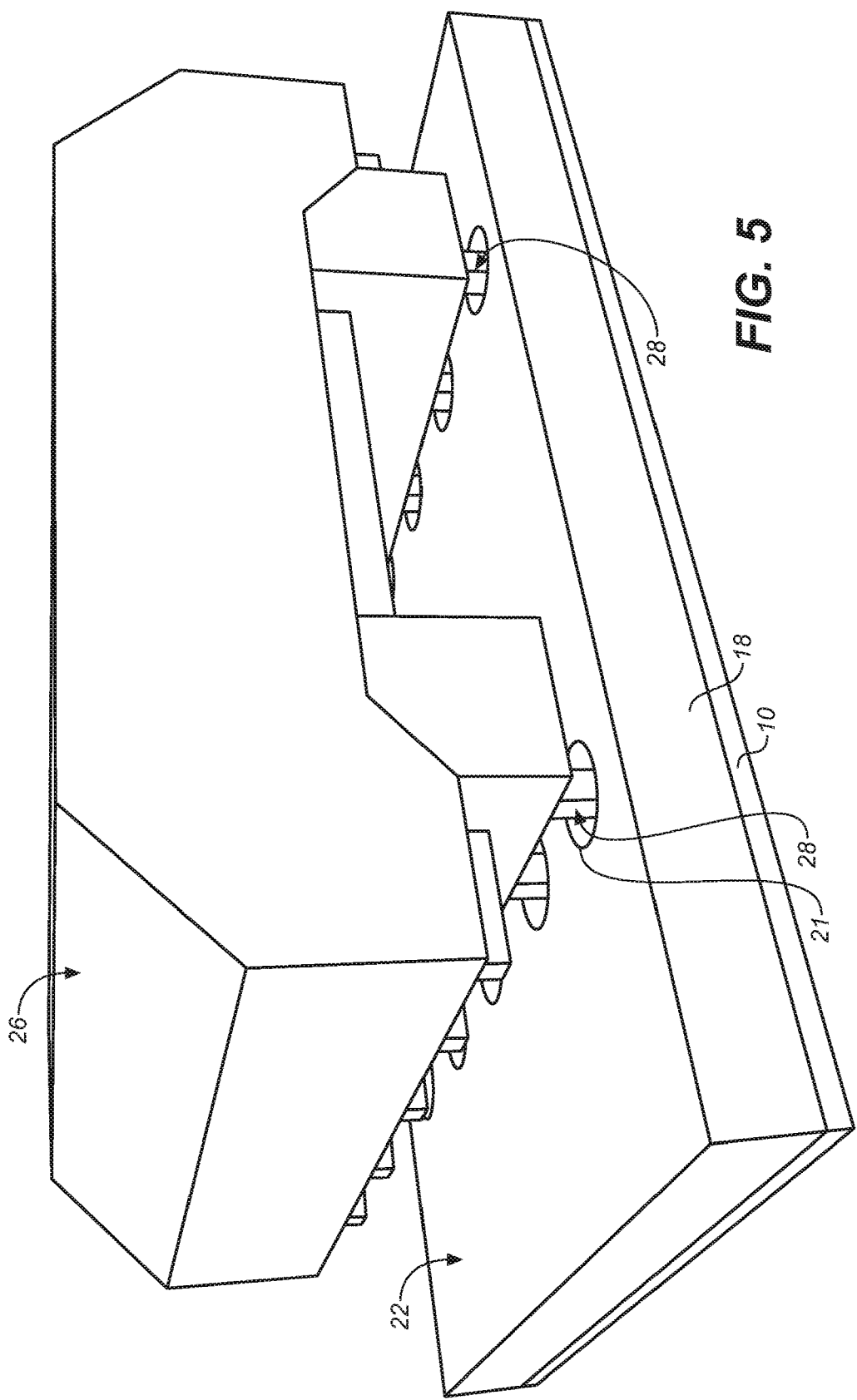
FIG. 5 illustrates one type of upper package whose metal posts are inserted through the holes in the bottom package to electrically contact the pads formed on the substrate.

FIG. 5 illustrates an upper package 26 having leads formed as rectangular posts 28. The holes 21 in the bottom package 22 align with the pattern of the posts 28. The bottom surface of the upper package 26 does not need to contact the top surface of the bottom package 22, and the angle of the upper package 26 may be adjusted during reflow to achieve a precise alignment of the upper package 26 with the bottom package 22. In one embodiment, the upper package 26 contains a transformer.

Figure 6:
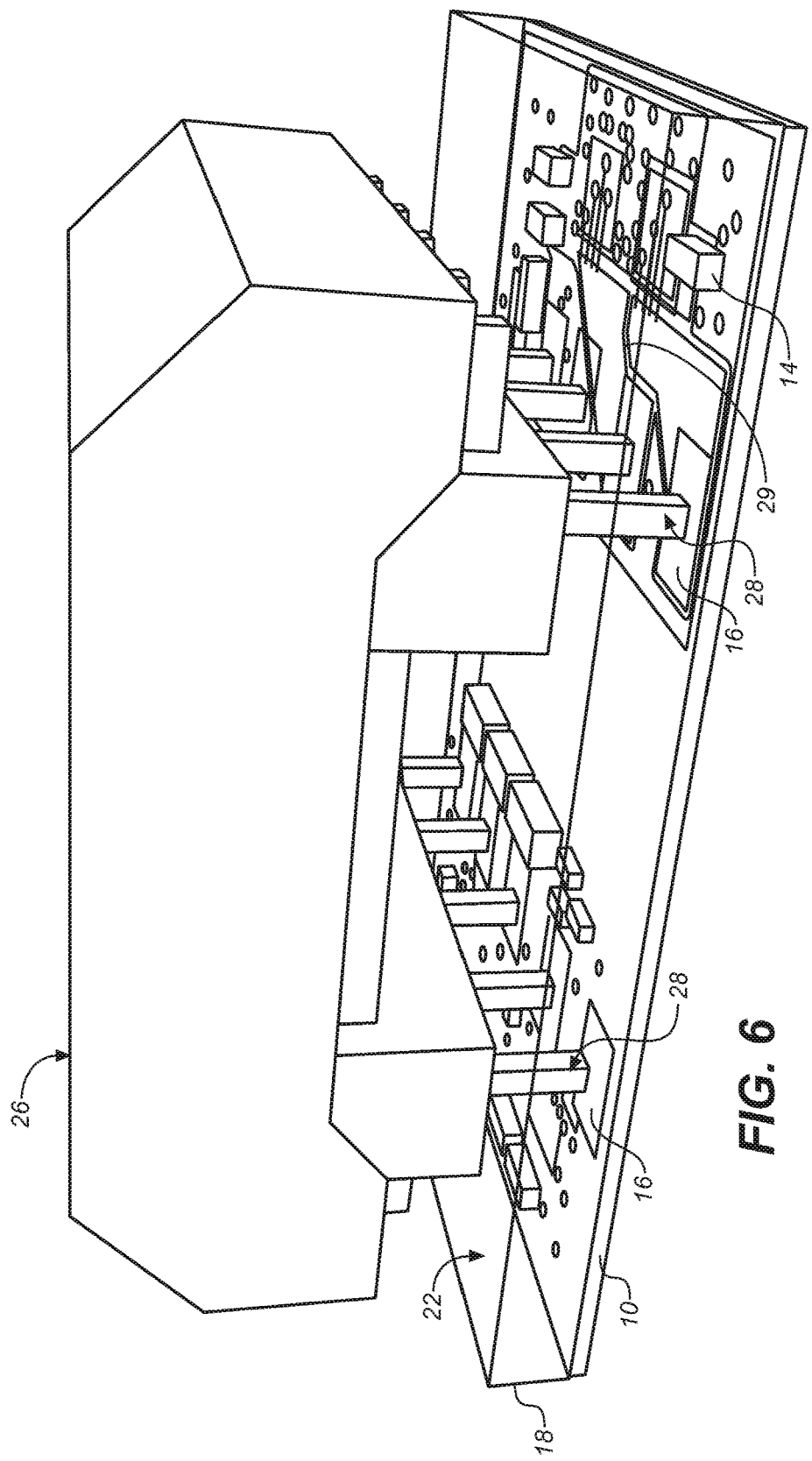
FIG. 6 illustrates the upper package of FIG. 5 as well as a transparent bottom package.

FIG. 6 illustrates the structure of FIG. 5 but where the bottom package 22 is transparent. The ends of the posts 28 will not all abut the pads 16 on the substrate 10 if either the posts 28 or the pads 16 are not coplanar.

Figure 7:
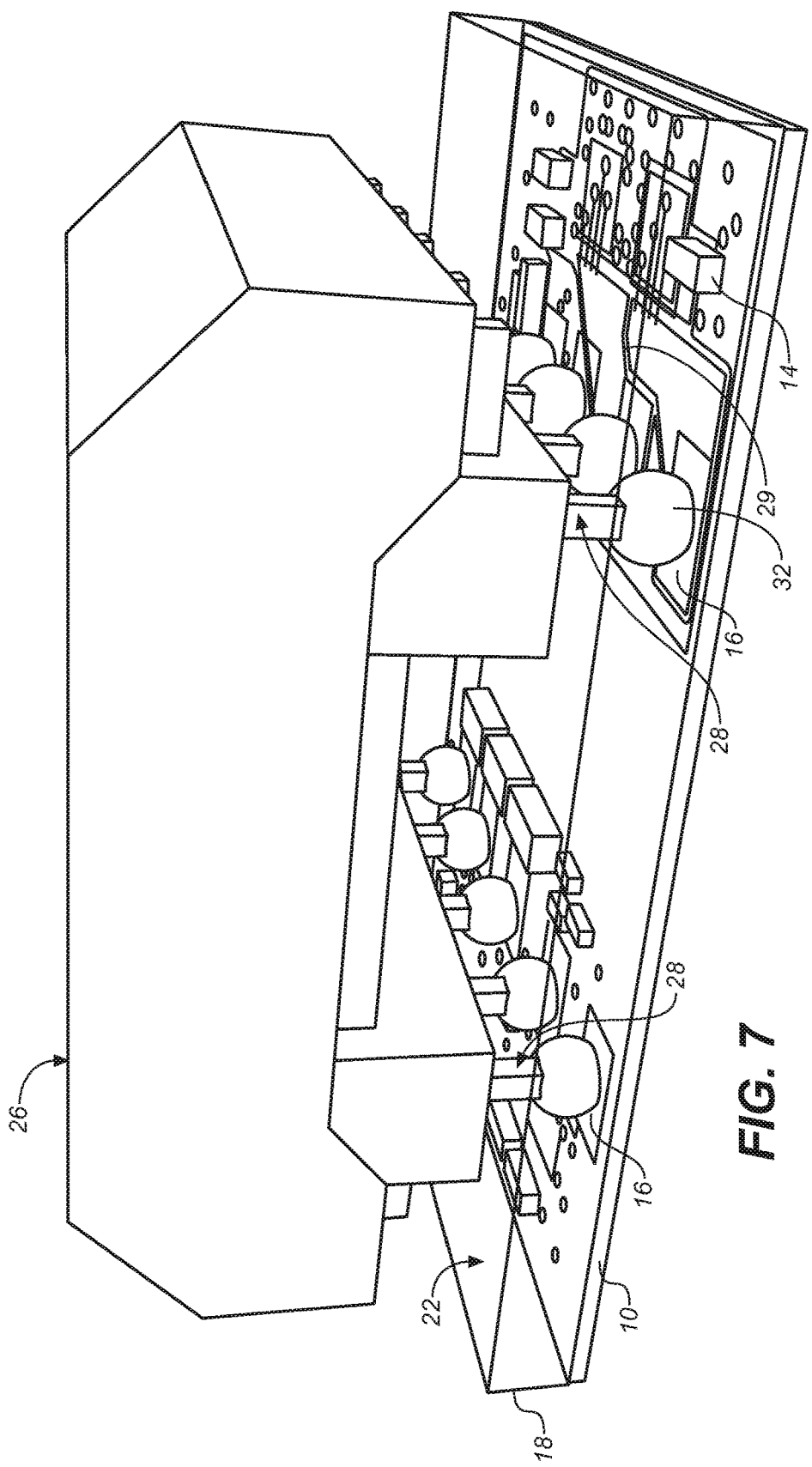
FIG. 7 illustrates an alternative to FIG. 6 where excess solder, or other conductive material, is deposited in the holes and wick up the posts when melted for a robust electrical connection.

As shown in FIG. 7, to account for this lack of coplanarity, the holes in the bottom package 22 are partially filled with a conductive material 32, such as solder, a solder paste, or other conductive material, prior to inserting the posts 28 into the holes 21, that allows the upper package 26 to be positioned precisely parallel with the bottom package 22. The conductive material 32 may be dispensed with a needle or squeegeed into the holes 21. Thus, it is desirable to form the holes 21 significantly wider than the posts 28 so the conductive material 32 is not pushed out by the posts 28.

The bottom surface of the upper package 26 may optionally be affixed to the top of the bottom package 22 using a thermal epoxy to firmly set the position of the upper package 26 on the bottom package 22 after a reflow step. During reflow, the conductive material 32 will melt and wick to the posts 28 and pads 16 for a good electrical, thermal, and mechanical connection, while the upper package 26 is being precisely aligned with the bottom package 22 using an alignment tool. During the reflow, the heat also cures the thermal epoxy.

Conductive traces 29 on the substrate 10 are shown interconnecting circuit components 14 and the pads 16.

After the upper package 26 posts 28 are soldered to the pads 16, the structure may be turned over and solder balls placed on the bottom pads 24 (FIG. 4) of the bottom package 22 to form a ball grid array. A reflow step melts the solder over the pads 24. Such a reflow step does not affect the position of the upper package 26 if the upper package 26 is epoxied to the bottom package 22.

Figure 8:
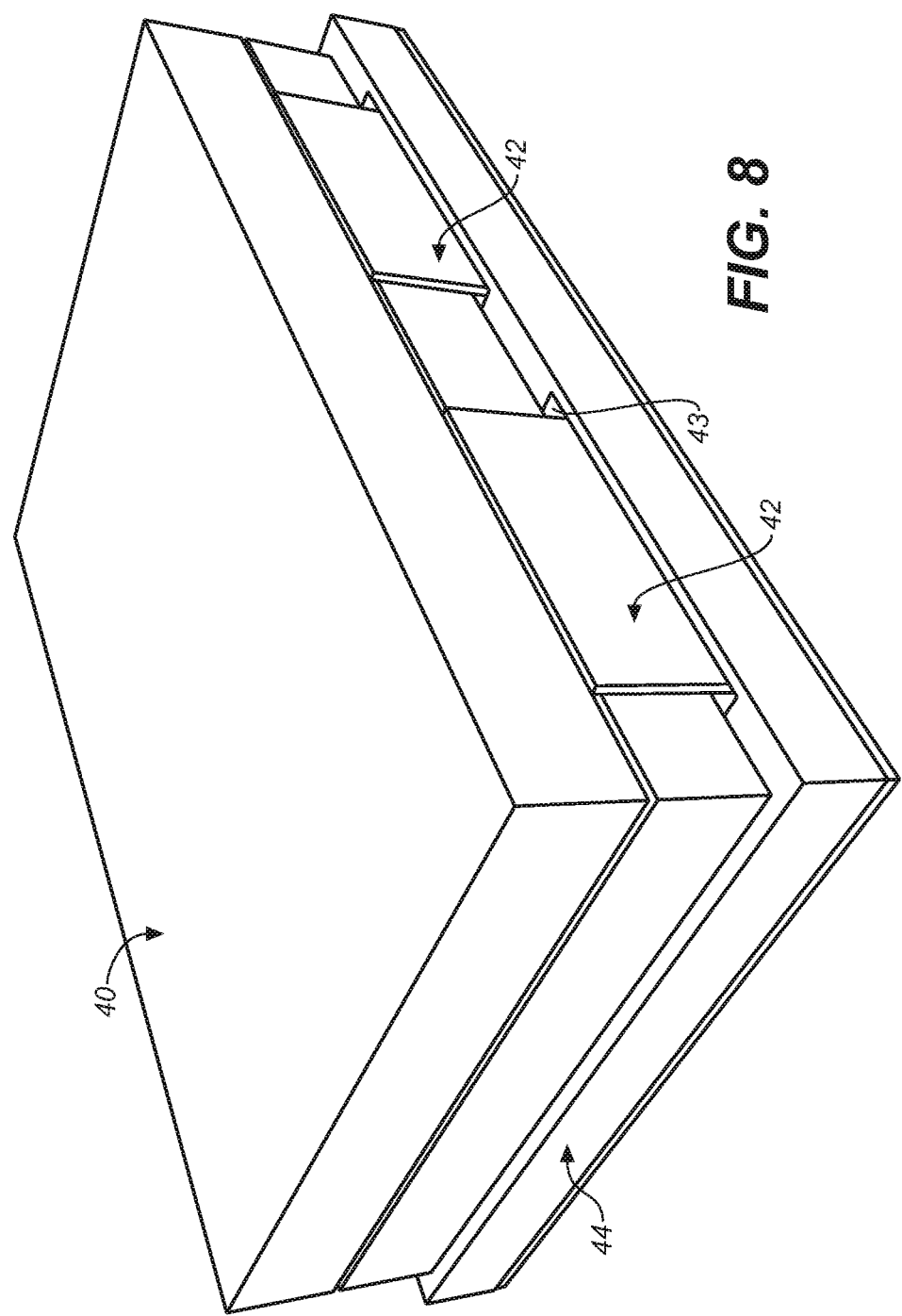
FIG. 8 illustrates a completed stacked package where the upper package uses staple-type leads around the perimeter of the upper package, and where the staple-type leads are inserted into laser drilled slots in the bottom package and electrically contact metal pads on the substrate in the bottom package.
Figure 9:
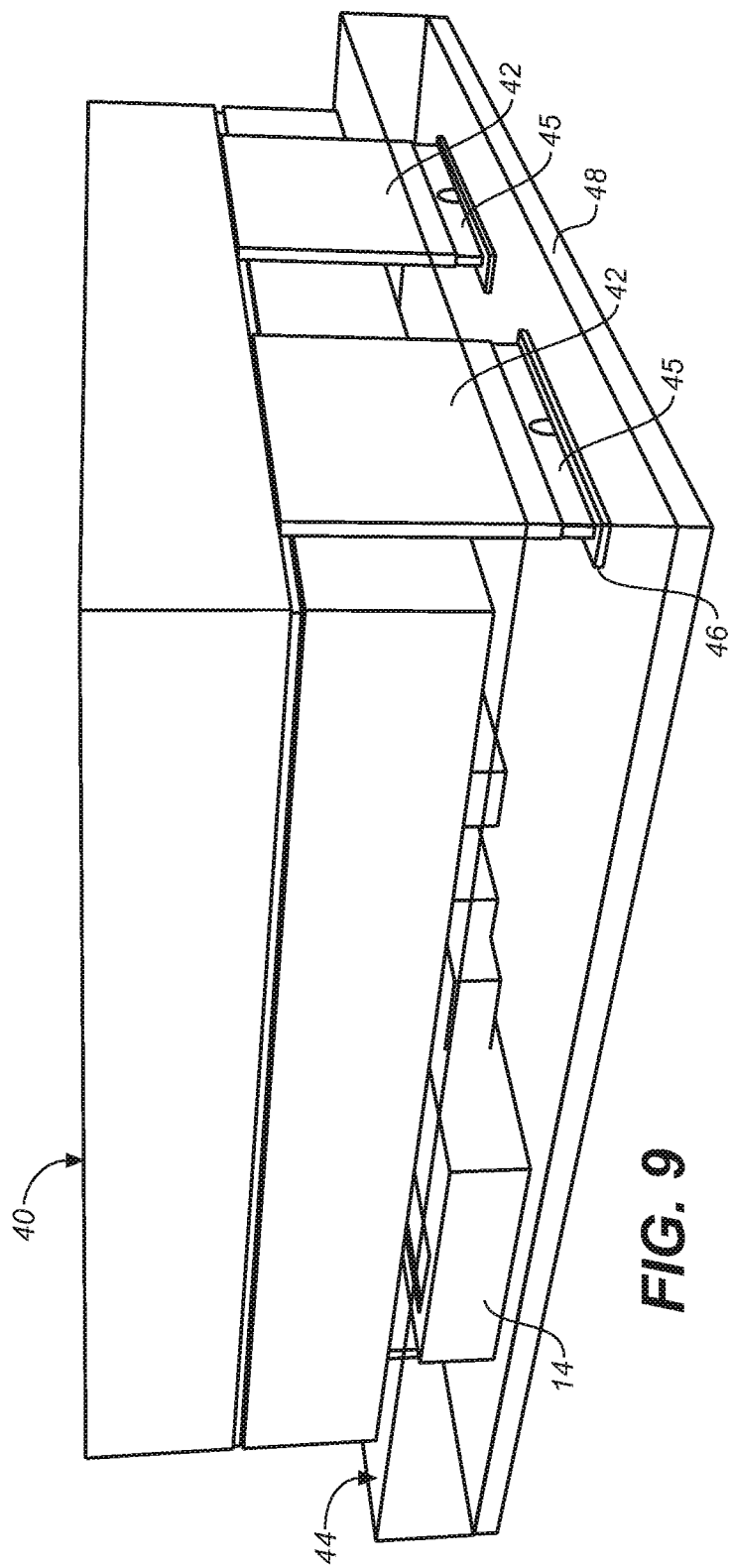
FIG. 9 illustrates the stacked package of FIG. 8 with a transparent bottom package.
Figure 10:
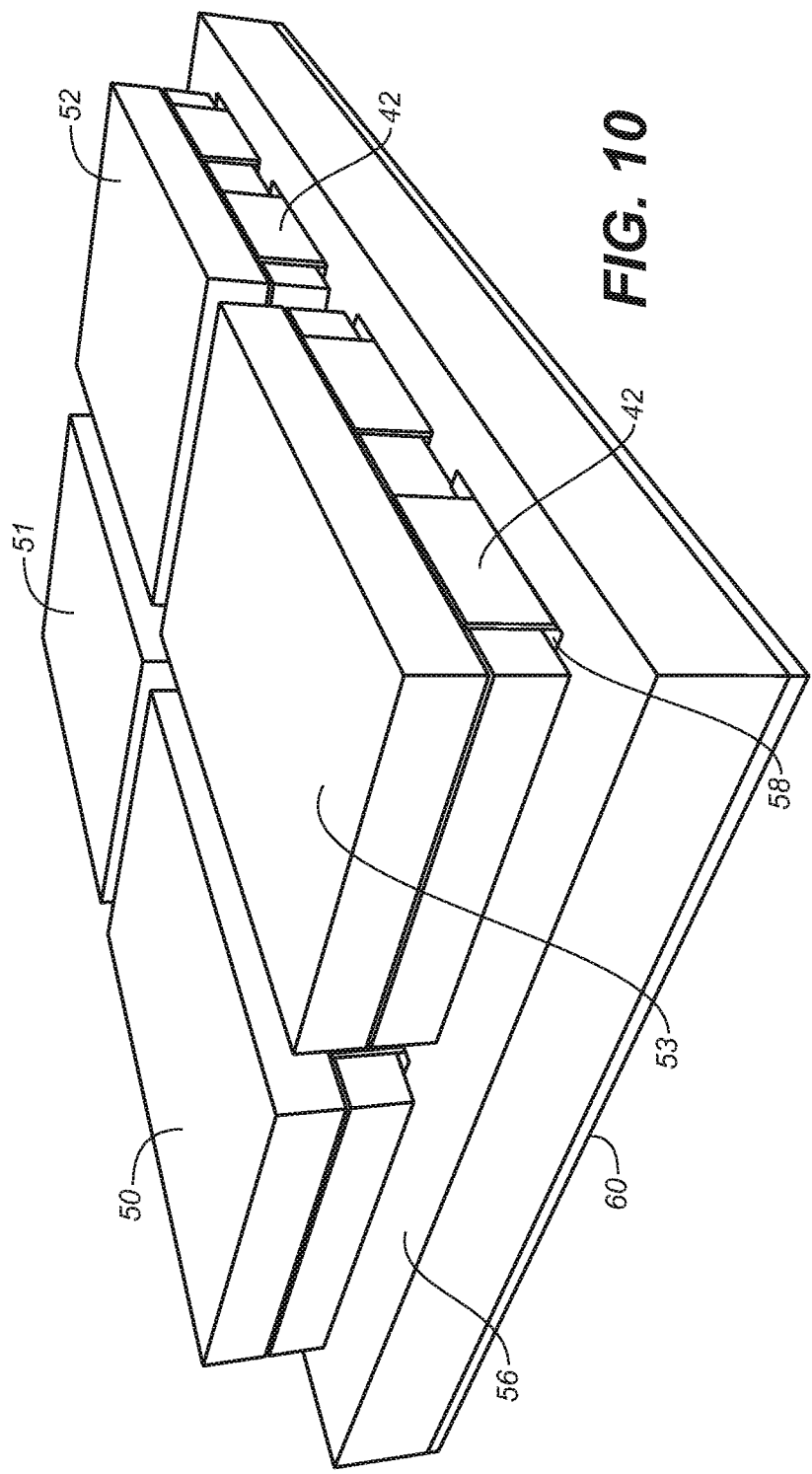
FIG. 10 illustrates multiple upper packages mounted over a single bottom package, where the tops of all the upper packages are co-planar.

FIGS. 8-10 illustrate a different type of lead for the upper package 40 known as a staple lead 42. A staple lead is a thin and wide lead that is a good conductor of high currents and heat. It is particularly desirable when the upper package 40 is a high power inductor for a switching regulator. In one embodiment, the inductor is encased in a ferrite material which is highly thermally conductive.

The bottom package 44 may be identical to the bottom package of FIG. 3, except for the location and shape of the pads and the laser drilled holes 43.

FIG. 9 shows the bottom package 44 as transparent and illustrates how the staple leads 42 extend through the laser drilled holes 43 (FIG. 8) in the bottom package 44 and may or may not abut the metal pads 46 formed on the substrate 48 of the bottom package 44. As previously described, after the holes 43 are formed, they are partially filled with a conductive material 45 that reflows and wicks to the pads 46 and the staple leads 42 for a good electrical, thermal, and mechanical connection.

The bottom of the upper package 40 may be epoxied to the top of the bottom package 44, using a thermal epoxy, to manipulate its alignment during the reflow step. The epoxy cures during the reflow step.

FIG. 10 illustrates how multiple upper packages 50-53 may be mounted over a single bottom package 56. The upper packages 50-53 each have four staple leads 42 that are inserted into laser drilled holes 58 in the bottom package 56 and electrically contact pads formed on the substrate 60. The bottom surface may be a ball grid array. Any other type of terminal configuration may be used.

Importantly, the ability to align each upper package 50-53 with respect to the bottom package 56 and with each other during the reflow step enables the top surfaces of all the upper packages 50-53 to be precisely coplanar. Therefore, a single heat sink with a flat surface may be positioned over the upper packages 50-53 and contact all the top surfaces equally.

Figure 11:
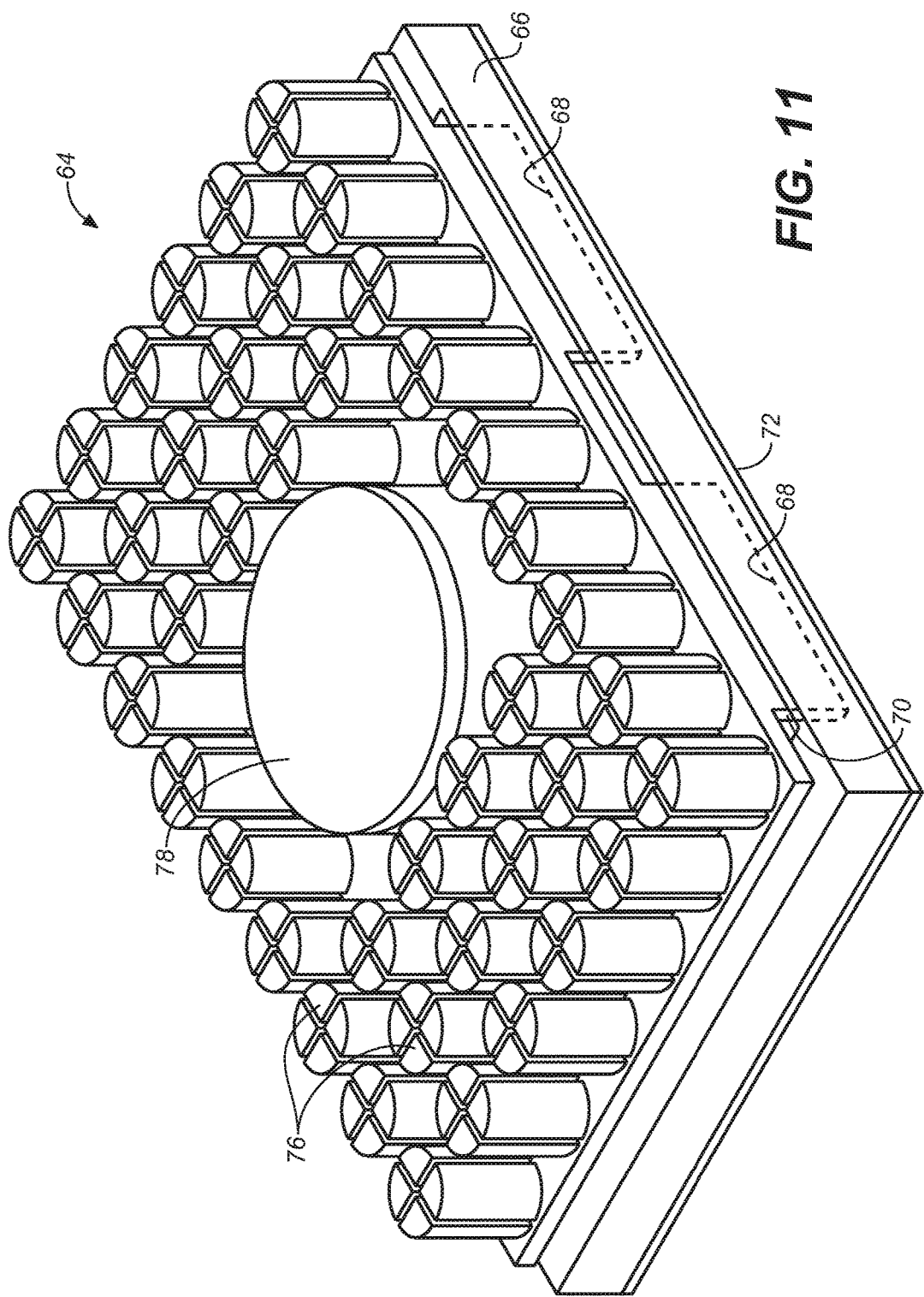
FIG. 11 illustrates a metal heat sink having tabs inserted through holes in the bottom package that are thermally connected to metal pads on the substrate of the bottom package.

FIG. 11 illustrates a heat sink 64 mounted over a bottom package 66. The heat sink 64 may be formed of copper or other thermally conductive material. The heat sink 64 has robust tabs 68 that extend into holes 70 (slots) laser drilled into the molded plastic of the bottom package 66. There may be distributed tabs 68 along the bottom of the heat sink 64, or the tabs 68 may just be along two or more sides of the heat sink 64.

The substrate 72 of the bottom package 66 has robust metal pads, similar to the pads 46 shown in FIG. 9, that are thermally coupled to the tabs 68. In one embodiment, prior to the heat sink 64 being mounted, a solder paste, a conductive epoxy, sinterable material, or some other thermally conductive material partially fills the holes 70, and the heat sink tabs 68 are inserted into the holes 70. The thermally conductive material fills any gap between the tabs 68 and the pads. Upon reflow, the thermally conductive material flows and then hardens, resulting in a good thermal and mechanical attachment of the heat sink 64 to the bottom package 66. The bottom surface of the heat sink 64 may be thermally epoxied to the top surface of the bottom package 66 for additional thermal contact. The heat sink 64 may be precisely aligned with the bottom package 66 during the reflow step, even if the tabs 68 are not coplanar, since the tabs 68 do not directly abut the metal pads on the substrate 72.

The metal pads on the substrate 72 may be grounded. The pads may also extend through the substrate 72 to terminate in the bottom pads 24 shown in FIG. 4. Such bottom pads 24 may then thermally contact a metal layer in a metal-core printed circuit board for additional heat sinking.

The heat sink 64 itself contains novel features. An array of segmented metal columns 76 is machined using conventional techniques to provide a large surface area for air cooling. A larger center protrusion 78, with a flat top, is provided to allow a robot arm or suction to grip the protrusion 78 and precisely mount the heat sink 64 on the bottom package 66 in an automated machine pick-and-place step.

In other embodiments, the upper package or other upper component may provide frequency isolation and/or shielding against RF, IF, or other radiated signal.

Multiple package structures may be formed simultaneously, and the packages are then singulated, such as by sawing.

In another embodiment, more than two packages may be vertically stacked using the techniques described above, where each upper package has leads that extend into laser drilled holes formed in its underlying package.

The technique described enables any degree of magnetic field isolation between the upper and bottom packages by providing a ground shield between the packages, or by providing adequate separation between the relevant components.

Instead of laser-drilling the holes, the holes may be formed by any other suitable method, such as during the molding of the bottom package, or mechanical drilling, or chemical etching.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A package structure for circuitry comprising:
   a bottom package comprising:
      a substrate having a top surface on which is mounted a first circuitry and having metal first pads on the top surface of the substrate;
      a molded layer over the top surface of the substrate encapsulating the first circuitry, the molded layer having a top surface; and
      holes formed through the top surface of the molded layer that allow access to the first pads on the substrate;
   an upper device comprising:
      at least one component having leads that align with the holes and extend through the holes to electrically or thermally contact the first pads on the substrate.

2. The structure of claim 1 wherein the upper device comprises:
   an upper package containing at least a circuit component connected to the first circuitry in the bottom package; and
   wherein the leads comprise electrical leads that align with the holes and extend through the holes to electrically contact the first pads on the substrate.

3. The structure of claim 2 further comprising a conductive material that partially fills the holes for electrically connecting the leads of the upper package to the first pads on the substrate without all the leads simultaneously abutting the first pads.

4. The structure of claim 2 wherein the first circuitry comprises at least a portion of a switching regulator and the at least one circuit component in the upper package comprises a transformer.

5. The structure of claim 2 wherein the first circuitry comprises at least a portion of a switching regulator and the at least one circuit component in the upper package comprises an inductor.

6. The structure of claim 1 wherein the substrate has a bottom surface on which electrical terminals are formed.

7. The structure of claim 6 wherein the electrical terminals comprise a ball grid array.

8. The structure of claim 1 wherein the holes are laser drilled.

9. The structure of claim 1 wherein the leads comprise posts.

10. The structure of claim 1 wherein the leads comprise staple leads.

11. The structure of claim 1 wherein the upper device comprises a heat sink having the leads that align with the holes and extend through the holes to thermally contact the first pads on the substrate for removing heat from the substrate.

12. The structure of claim 11 wherein the heat sink has segmented columns on its top surface.

13. The structure of claim 11 wherein the heat sink has a protrusion on its top surface for holding the heat sink by a robot arm in a pick and place process.

14. A method of forming a package structure comprising:
forming a substrate having a top surface;
mounting a first circuitry on the top surface of the substrate and forming metal first pads on the top surface of the substrate;
molding a molded layer over the top surface of the substrate encapsulating the first circuitry, the molded layer having a top surface;
forming holes through the top surface of the molded layer that allow access to the first pads on the substrate, the substrate and molded layer forming a bottom package;
providing an upper device comprising at least one component having leads that align with the holes; and
inserting the leads through the holes to electrically or thermally contact the first pads on the substrate.

15. The method of claim 14 wherein the step of providing the upper device comprises providing at least a circuit component in an upper package for connection to the first circuitry in the bottom package, and wherein the step of inserting the leads comprises inserting electrical leads of the upper package through the holes to electrically contact the first pads on the substrate.

16. The method of claim 14 further comprising at least partially filling the holes with a conductive material prior to inserting the leads through the holes.

17. The method of claim 16 further comprising heating the conductive material to flow the conductive material to wick to the leads of the upper device and the first pads of the substrate.

18. The method of claim 16 wherein the conductive material comprises a solder paste.

19. The method of claim 14 wherein the step of forming holes comprises laser drilling the holes.

20. The method of claim 14 further comprising wetting the first pads with a solder prior to the step of molding.

21. The method of claim 14 further comprising forming a ball grid array on a bottom surface of the substrate.

22. The method of claim 14 wherein the leads of the upper device comprise posts.

23. The method of claim 14 wherein the leads of the upper device comprise staple-type leads.

24. The method of claim 14 wherein the first circuitry comprises at least a portion of a switching regulator and the upper device comprises a transformer.

25. The method of claim 14 wherein the first circuitry comprises at least a portion of a switching regulator and the upper device comprises an inductor.

26. The method of claim 14 wherein the upper device comprises a heat sink having the leads that align with the holes and extend through the holes to thermally contact the first pads on the substrate for removing heat from the substrate.

27. The method of claim 26 wherein the heat sink has a protrusion on its top surface, the method further comprising holding the protrusion by a robot arm in a pick and place process to position the heat sink on the bottom package.

\* \* \* \* \*